United States Patent
Northcott

(10) Patent No.: US 8,386,897 B1
(45) Date of Patent: Feb. 26, 2013

(54) CYCLICALLY INTERLEAVED DUAL BCH, WITH SIMULTANEOUS DECODE AND PER-CODEWORD MAXIMUM LIKELIHOOD RECONCILIATION

(75) Inventor: Phil Northcott, Coquitlam (CA)

(73) Assignee: PMC-Sierra US, Inc., Santa Clara, CA (US)

( * ) Notice: Subject to any disclaimer, the term of this patent is extended or adjusted under 35 U.S.C. 154(b) by 0 days.

(21) Appl. No.: 13/483,640

(22) Filed: May 30, 2012

Related U.S. Application Data

(62) Division of application No. 12/720,487, filed on Mar. 9, 2010.

(60) Provisional application No. 61/158,646, filed on Mar. 9, 2009.

(51) Int. Cl.
*H03M 13/00* (2006.01)
*H03M 13/03* (2006.01)

(52) U.S. Cl. .................................. 714/786; 714/758

(58) Field of Classification Search .................. None
See application file for complete search history.

(56) References Cited

U.S. PATENT DOCUMENTS

| | | | |
|---|---|---|---|
| 6,738,942 B1 | 5/2004 | Sridharan et al. | |
| 7,831,887 B2 | 11/2010 | Joyce et al. | |
| 8,065,585 B1 | 11/2011 | Abbaszadeh et al. | |
| 2003/0106009 A1 | 6/2003 | Jarchi et al. | |
| 2004/0252725 A1 | 12/2004 | Sun et al. | |
| 2008/0028274 A1 | 1/2008 | Lin | |
| 2009/0169217 A1 | 7/2009 | Meagher et al. | |

*Primary Examiner* — Guerrier Merant

(74) *Attorney, Agent, or Firm* — Curtis B. Behmann; Borden Ladner Gervais LLP

(57) ABSTRACT

A method and system are provided for forward error correction. Embodiments of the present disclosure provide a strong FEC algorithm that performs similarly to RS(255,239) when a simple decoder is used, and scales up linearly to a full-scale decoder that outperforms all 7% algorithms currently in G.975.1. The Forward Error Correction code is suitable for use in optical transport networks (OTN) and other applications requiring high decode performance and high code rate. Embodiments of the present disclosure provide an FEC code that is a cyclically interleaved dual BCH, with simultaneous decode and per-codeword maximum likelihood reconciliation.

15 Claims, 9 Drawing Sheets

CYCLICALLY INTERLEAVED DUAL BCH, WITH SIMULTANEOUS DECODE AND PER-CODEWORD MAXIMUM LIKELIHOOD RECONCILIATION

CROSS REFERENCE TO RELATED APPLICATIONS

This application is a divisional application of U.S. patent application Ser. No. 12/720,487, filed Mar. 9, 2010, which claims priority from U.S. Provisional Patent Application No. 61/158,646 filed Mar. 9, 2009, which is incorporated herein by reference.

FIELD

The present disclosure relates generally to error correction. More particularly, the present disclosure relates to high code-rate forward error correction codes for optical and high performance applications.

BACKGROUND

Two-dimensional concatenated block codes are widely used at 10 G, for example those defined in annexes 1.4, 1.7, and 1.9 of ITU-T G.975.1. FIG. 1 shows a generic 2-D code, in which every bit is covered by two block codes. Decoding proceeds by correcting each row, then each column, and iterating. This is an excellent strategy, but each row is covered only by the columns, and each column only by the rows.

As data rates have risen to 40 G and 100 G, a forward error correction (FEC) stronger than the standard RS(255,239) has become necessary on a majority of links. At 10 G and 40 G, this has resulted in the implementation of a variety of strong, proprietary Intra Domain Interface (IaDI) FECs that do not interoperate.

It is, therefore, desirable to provide an improved FEC.

BRIEF DESCRIPTION OF THE DRAWINGS

Embodiments of the present disclosure will now be described, by way of example only, with reference to the attached Figures, wherein.

DETAILED DESCRIPTION

Figure 1:
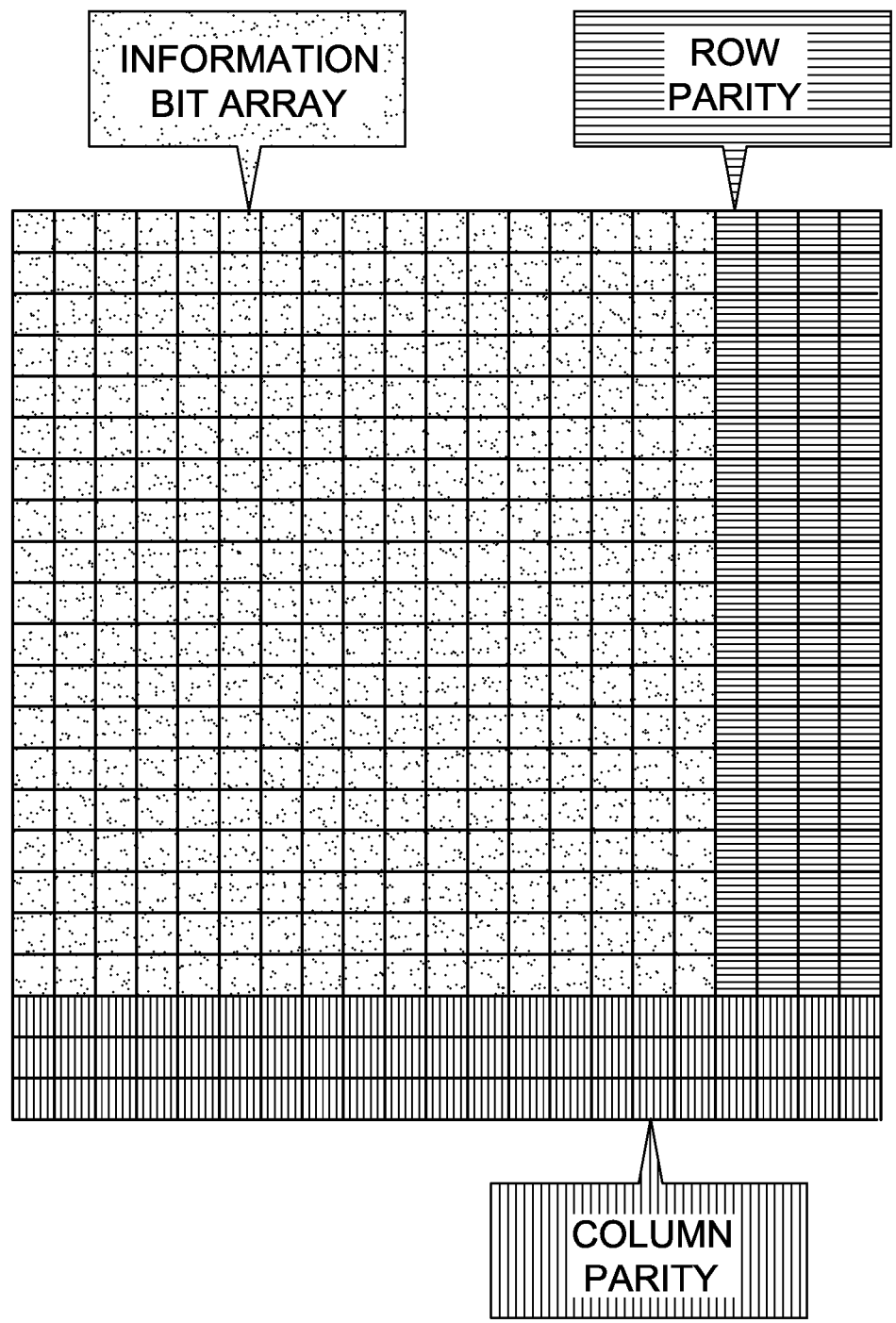
FIG. 1 illustrates a generic 2-D code, in which every bit is covered by two block codes.

It is an object of the present disclosure to obviate or mitigate at least one disadvantage of previous error correction code approaches.

According to an aspect, there is provided a method of constructing a codeword in a forward error correction system having K information bits in a total of N bits. The method comprises obtaining K/2 home column information bits from a home column of an information bit array; obtaining K/2 away column information bits from a selected number of away columns of the information bit array, the selected number of away columns consisting of information bit array columns other than the home column; combining the K/2 home column information bits with the K/2 away column information bits to assemble K information bits; calculating N−K redundant parity bits associated with the assembled K information bits according to an error control code; and appending the N−K redundant parity bits to the assembled K information bits to assemble the codeword valid under the error control code.

The method can also include prepending padding bits, for example, null bits or zero bits, to the assembled K information bits.

The K/2 home column information bits and the K/2 away column information bits can be combined in an alternating manner to assemble the K information bits.

The K/2 away column information bits can be obtained by following a diagonal progression through the selected number of away columns that skips the home column. The K/2 away column information bits can also be obtained by following a diagonal progression through the selected number of away columns that skips the home column and one or more columns adjacent to the home column. The K/2 away column information bits can be obtained beginning at a first away column adjacent the home column.

In an embodiment, the K/2 home column information bits and the K/2 away column information bits are combined by interleaving the K/2 home column information bits and the K/2 away column information bits to assemble the K information bits.

The error control code can be a BCH (Bose, Chaudhuri, and Hocquenghem) code. The method for forward error correction can be performed by interleaving large-block BCH codes, decoding them all at once, and using confidence levels to reconcile the decoder outputs. Every information bit can be covered by at least two codewords, and such that every codeword shares bits with every other codeword.

The above method can be implemented in an apparatus for forward error correction having means for interleaving large-block BCH codes, means for decoding them all at once, and means for using confidence levels to reconcile the decoder outputs.

In an aspect, there is an encoding procedure comprising constructing an information bit array by placing information bits into the information bit array; constructing W codewords, each N bits long, with null parity and zero padding; calculating T*M bits of BCH parity for each codeword, and inserting the calculated parity bits into a message block; constructing parity codewords, and calculating the parity on parity array; adding framing by generating frames; and transmitting the message block with the generated frames.

The information bit array can be constructed by sequentially assigning a row and column address to each incoming data bit. The codewords can be constructed using a programmable shift register to perform the interleaving function as an interleaver in order to construct the codewords as described above.

The hardware for BCH encoding may be implemented as a convenient number of BCH encoders, each capable of handling one or more BCH codewords in a time-interleaved fashion. The parity bits can be inserted into each codeword by writing them into the appropriate position in a memory. The BCH parity can be formed into new codewords, and the parity on parity can be calculated using the BCH parity by the aforementioned method. The parity on parity bits can be inserted into the message block by writing them into the appropriate position in a memory. Any desired framing (for instance, G.709 FAS and MFAS, plus a pointer indicating the current row and column position within the message block) can be added and the message block can be transmitted.

In an aspect, there is provided a method of decoding an encoded bit stream having encoded information bits, encoded parity bits and encoded parity-on-parity bits. The method comprises assembling information codewords from the encoded information bits and the encoded parity bits; assembling parity codewords from the encoded parity bits and the encoded parity-on-parity bits; decoding the information codewords and the parity codewords to provide decoded information codewords, decoded parity codewords and associated per-codeword confidence metric for each of the decoded information codewords and for each of the decoded parity codewords. For each information bit to be decoded, each information bit being associated with two decoded information codewords, the method comprises obtaining the decoded information bit based on one of the two decoded information codeword having a higher per-codeword confidence metric.

Each parity bit to be decoded can have one corresponding decoded information codeword and one decoded parity codeword. Each decoded parity codeword can have a corresponding error mask and a corresponding error count. For each parity bit to be decoded, the corresponding error codes and the corresponding error counts of the corresponding decoded information codeword and decoded parity codeword can be reconciled to identify a reconciled parity codeword having a higher per-codeword confidence metric.

The per-codeword confidence metric can be determined by determining an error count for each of the decoded information codewords and the decoded parity codewords. The per-codeword confidence metric can be determined by determining a correctability flag for each decoded information codewords and for each of the decoded parity codewords. The correctability flag can be encoded as a particular value of the error count or a particular value of a confidence metric for each of the decoded information codewords and the decoded parity codewords. Each of the decoded information codewords and the decoded parity codewords is associated with an error mask.

A default error mask and a default error count can be assigned for each of the decoded information codewords and the decoded parity codewords that are uncorrectable.

Each of the decoded information codeword can have a corresponding error mask and a corresponding error count. For each information bit to be decoded, the corresponding error codes and the corresponding error counts of the two corresponding decoded information codewords can be reconciled to identify a reconciled information codeword having the higher per-codeword confidence metric.

The error mask of the reconciled information codeword and the error mask of the reconciled parity codeword can be applied on the reconciled information codeword and the reconciled parity codeword respectively to obtain the decoded information bit and the decoded parity bit, respectively.

The reconciled information codeword can be determined based comparing the two error counts of the two corresponding decoded information codewords. The reconciled party codeword can be compared based comparing the two error counts of the two corresponding decoded parity codewords.

In an aspect, there is provided an encoder comprising an information bit array assembly module and a codeword assembly module. The information bit array assembly module assembles information bits into an information bit array. The codeword assembly module assembles a codeword in a forward error correction system having K information bits in a total on N bits by obtaining K/2 home column information bits form a home column of the information bit array; obtaining K/2 away column information bits from a selected number of away columns of the information bit array, the selected number of away columns consisting of information bit array columns other than the home column; combining the K/2 home column information bits with the K/2 away column information bits to assemble K information bits; calculating N−K redundant parity bits associated with the assembled K information bits according to an error control code; and appending the N−K redundant parity bits to the assembled K information bits to assemble the codeword valid under the error control code.

The codeword assembly module can prepend padding bits, for example, zero or null bits, to the assembled K information bits. The K/2 home column information bits and the K/2 away column information bits can be combined in an alternating manner to assemble the K information bits.

The codeword assembly module can include a plurality of programmable shift registers to store the information bits during assembly of the codeword. The plurality of programmable shift registers interleave the K/2 home column information bits and the K/2 away column information bits to assemble the K information bits.

The encoder can further include a codeword assembly module; a parity bit array assembly module and a parity on parity array assembly module. The codeword assembly module assembles a plurality of codewords associated with the information bits into a codeword array. The parity bit array assembly module assembles N−K redundant parity bits into a parity bit array. The parity on parity array assembly module assembles parity on parity bits into a parity on parity bit array. The parity on parity bits can be associated with the N−K redundant parity bits.

The encoder can also include a framing module for combing the codeword array, the parity bit array, and the parity on parity array into an encoded message block.

In another aspect, there is provided a decoder for decoding an encoded bit stream having encoded information bits, encoded parity bits and encoded parity on parity bits. The decoder comprises an information codeword assembly module; a parity codeword assembly module; a codeword decoding module; and an information bit decoding module. The information codeword assembly module assembles information codewords from the encoded information bits and the encoded parity bits. The parity codeword assembly module assembles parity codewords from the encoded parity bits and the encoded parity-on-parity bits. The codeword decoding module decodes information codewords and parity codewords to provide decoded information codewords and decoded parity codewords and associated per-codeword confidence metric for each of the decoded information codewords and for each of the decoded parity codewords. The information bit decoding module decodes each information bit of the encoded bit stream, each information bit being associated with two decoded information codewords, by obtaining the decoded information bit based on one of the two decoded information codeword having a higher per-codeword confidence metric.

The decoder can further comprise a parity bit decoding module for decoding each parity bit of the encoded bit stream, each parity bit being associated with one decoded information codeword and one decoded parity codewords, by obtaining the decoded parity bit based on one of the decoded information codeword and the decoded parity codeword having a higher per-codeword confidence metric.

In another aspect there is provided an encoder comprising an information bit array assembly module; a information codeword array assembly module; a parity bit array assembly module; a parity codeword array assembly module; a parity on parity array assembly module and a framing module. The information bit array assembly module assembles information bits into an information bit array. The information codeword array assembly module assembles a plurality of information codewords associated with the information bits into an information codeword array, each information bit being associated with two information codewords. The parity bit array assembly module assembles parity bits into a parity bit array, the parity bits associated with the plurality of information codewords according to an error control code. The parity codeword array assembly module assembles a plurality of parity codewords associated with the information bits into a parity codeword array. The parity on parity array assembly module assembles parity on parity bits into a parity on parity bit array, the parity on parity bits being associated with the parity bits according to the error control code. The framing module combines the information codeword array, the parity codeword array, and the parity on parity array into an encoded message block.

In another aspect there is provided a method for encoding comprising: assembling information bits into an information bit array; assembling a plurality of information codewords associated with the information bits into an information codeword array, each information bit being associated with two information codewords; assembling parity bits into a parity bit array, the parity bits associated with the plurality of information codewords; assembling a plurality of parity codewords associated with the information bits into a parity codeword array; and assembling parity on parity bits into a parity on parity bit array, the parity on parity bits being associated with the parity bits. The method for encoding can further include combining the information codeword array, the parity codeword array, and the parity on parity array into an encoded message block.

In the interest of increased interoperability, it is desirable to specify a 0.937 rate FEC that is suitable for both Inter Domain Interface (IrDI) and metro IaDI applications.

Embodiments of the present disclosure provide an approach, adapted from low density parity check (LDPC), whereby every block code covers every other block code, thus maximizing the redundancy that can be applied to error patterns.

Other aspects and features of the present disclosure will become apparent to those ordinarily skilled in the art upon review of the following description of specific embodiments of the disclosure in conjunction with the accompanying figures.

Generally, the present disclosure provides a method and system for forward error correction. For IrDI applications, it is important that the implementation be relatively compact, low power, and low latency. For Metro/Regional IaDI applications, coding gain is very important, while higher latency and power are acceptable.

Embodiments of the present disclosure provide a strong FEC algorithm that performs similarly to RS(255,239) when a simple decoder is used, and scales up linearly to a full-scale decoder that outperforms all 7% algorithms currently in G.975.1. The Forward Error Correction code used in such embodiments is suitable for use in optical transport networks (OTN) and other applications requiring high decode performance and high code rate. Embodiments of the present disclosure provide an FEC code that is a cyclically interleaved dual BCH, with simultaneous decode and per-codeword maximum likelihood reconciliation.

Figure 2:
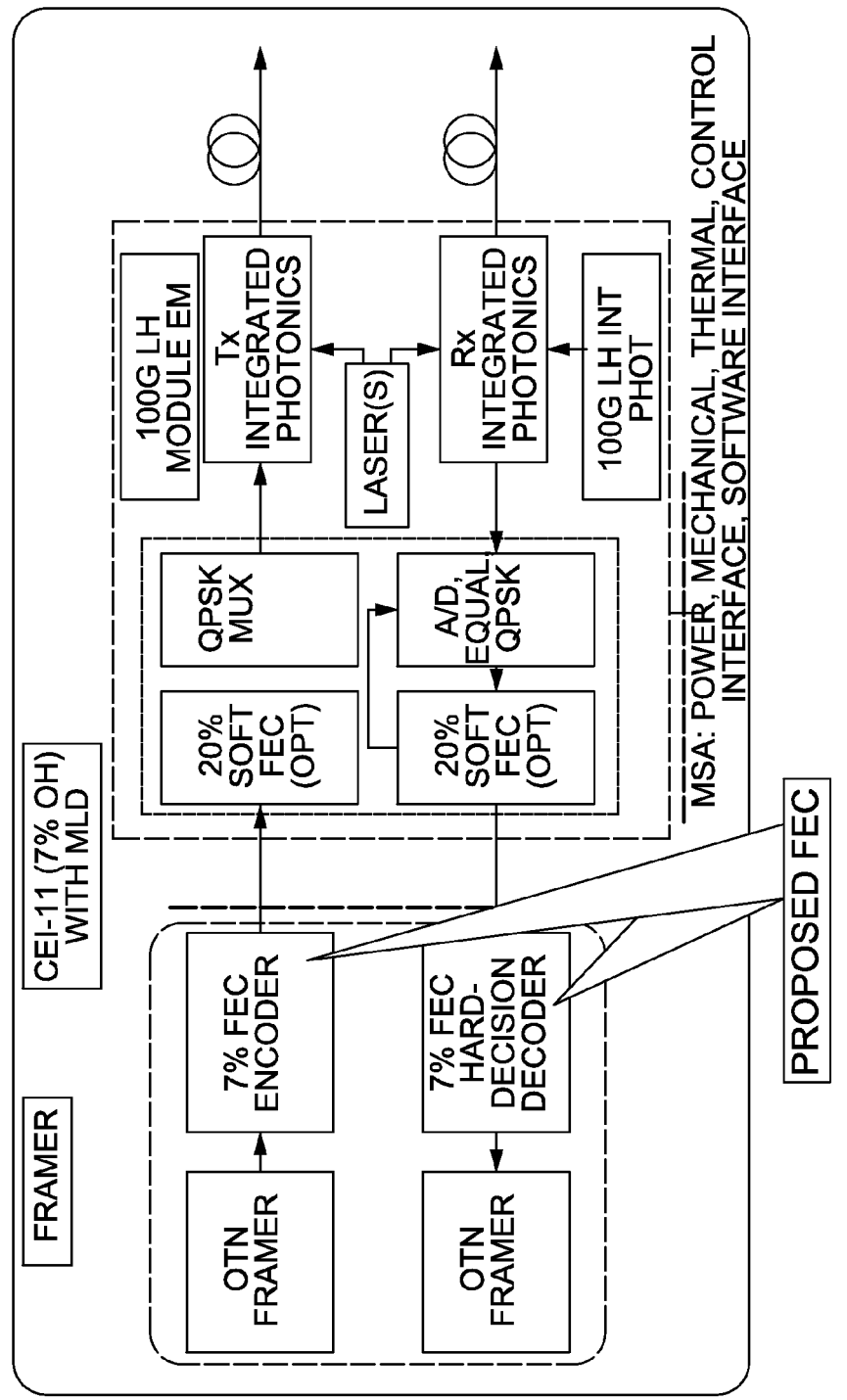
FIG. 2 illustrates an example implementation of a module/framer interface according to an embodiment of the present disclosure.

FIG. 2 illustrates an example implementation of a module/framer interface according to an embodiment of the present disclosure. FIG. 2 illustrates an exemplary context in which embodiments of the present disclosure can be implemented. This embodiment provides a Forward Error Correction code suitable for use in optical transport networks (OTN) and other applications requiring high decode performance (e.g. 9 dB net coding gain at 1E−15 output bit error rate) and high code rate (e.g. R=239/255 for OTN).

Embodiments of the present disclosure draw elements from LDPC and from the 2-D codes in ITU G.975.1, and combines them in a novel way. There are 2-Dimensional and 3-Dimensional FECs (e.g. ITU-T G.975.1 Annexes I.4, I.7, I.9) that use two or more concatenated block codes (RS and/or BCH) with iterative decode. There are 2-D codes (e.g. ITU-T G.975.1 AnnexI.7, and most 'turbo' codes) whose dimensions are chosen so that no two codewords share more than X bits, where X<T for one or more of the component codes. There are codes (ITU-T G.975.1 Annex I.9) that are designed to have an erasure-decoding step at the end. LDPC techniques compute all the redundant information at once, and use bit-wise confidence measures to resolve between them.

Embodiments of the present disclosure are unique in the way they interleave large-block BCH codes, decode them all at once, and use confidence levels to combine them. Like a 2-D code, every bit in a code according to an embodiment of the present disclosure is covered by exactly two codewords. However, simultaneous decode of all codewords at once allows for twice as many iterations for the same latency/memory as a 2D code. Per-codeword confidence metrics reduce the impact of false correction compared with existing 2D codes, without the very high implementation cost of a true 'soft' decode. Use of large BCH blocks allows for excellent performance at low overhead (7%) compared with LDPC.

Embodiments of the present disclosure provide an FEC code that is a cyclically interleaved dual BCH, with simultaneous decode and per-codeword maximum likelihood reconciliation. For conciseness, this will be referred to as a "Swizzle" code hereinafter. Further details on a particular embodiment will now be provided.

The base component code is a shortened BCH (N,K,T). One instance of this BCH (K message bits, N−K=T*M parity bits, and Z=$2^M$−N−1 prepended zeroes) is a Codeword, where error correction capability is T bits, and M is the order of the BCH. M is roundup(log 2(N)). Padding length Z is $2^M$−N−1.

A group of codewords, intended to be decoded iteratively as a group, are a Code Block. A Code Block is an array N bits high by W bits wide.

Figure 3:
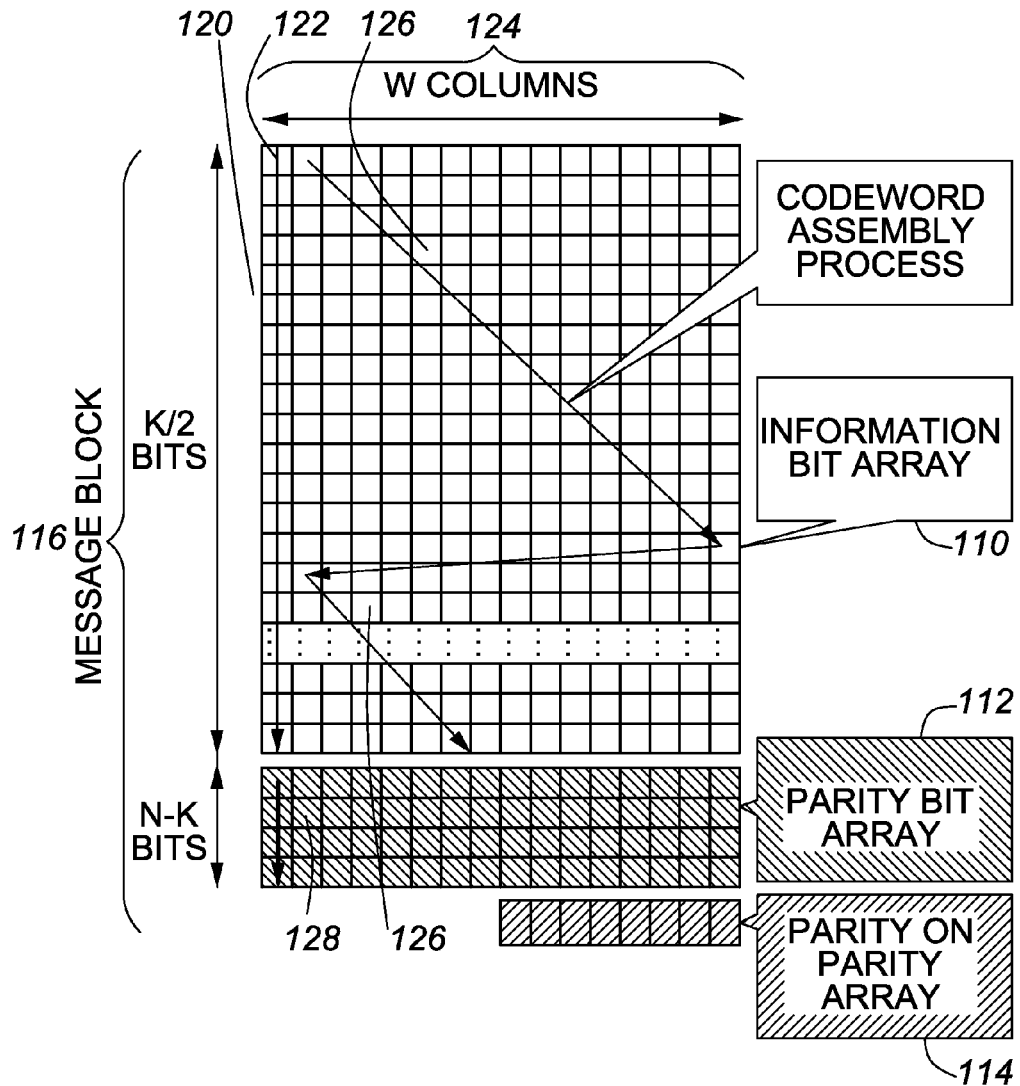
FIG. 3 illustrates a message block and some steps in a method of codeword construction according to an embodiment of the present disclosure.

FIG. 3 illustrates a message block and steps in a method of codeword construction according to an embodiment of the present disclosure. The message bits, or uncoded information bits, can be arranged into a message array shown in FIG. 3 as an information bit array 110 that is K/2 bits high, and W bits wide, where W is the number of interleaved codewords in a block. W can be chosen to be large enough to minimize the chance that two codewords interleave in such a way that both are uncorrectable, for example that (K/2 W)=<T−1.

A codeword w includes the K/2 bits in information array column w (from among the columns W), plus an additional K/2 message bits selected by the Interleaver from other columns, plus T*M parity bits, plus sufficient zeros to pad out the codeword to $2^M-1$ bits. Calculating the parity bits associated with the assembled codewords yields a Parity Array 112 that is W bits wide and T*M bits high.

Stacking the information bit array 110 with the parity array 112, and appending a Parity-on-Parity array 114, yields the N×W Message Block 116. The Information Bit Array 110, the Parity Bit Array 102 calculated from the codewords, and the Parity-On-Parity Array 114 together form the Message Block 116 that is transmitted. Framing information, or framing, (not shown in FIG. 3) for instance OTN framing plus MFAS, once per frame, is added, and transmitted by reading left-to-right, top-to-bottom. In embodiments, the Message Block plus framing is what is actually transmitted.

Performance data can be provided for a Message Block using parameters N=1761, K=1706, T=5, and W=352, according to an embodiment of the present disclosure.

A basic property of an interleaving strategy according to an embodiment of the present disclosure is that every information bit be covered D times. In an exemplary embodiment, a value of D=2, according to which every information bit is covered exactly twice, yields a desired performance.

Figure 4:
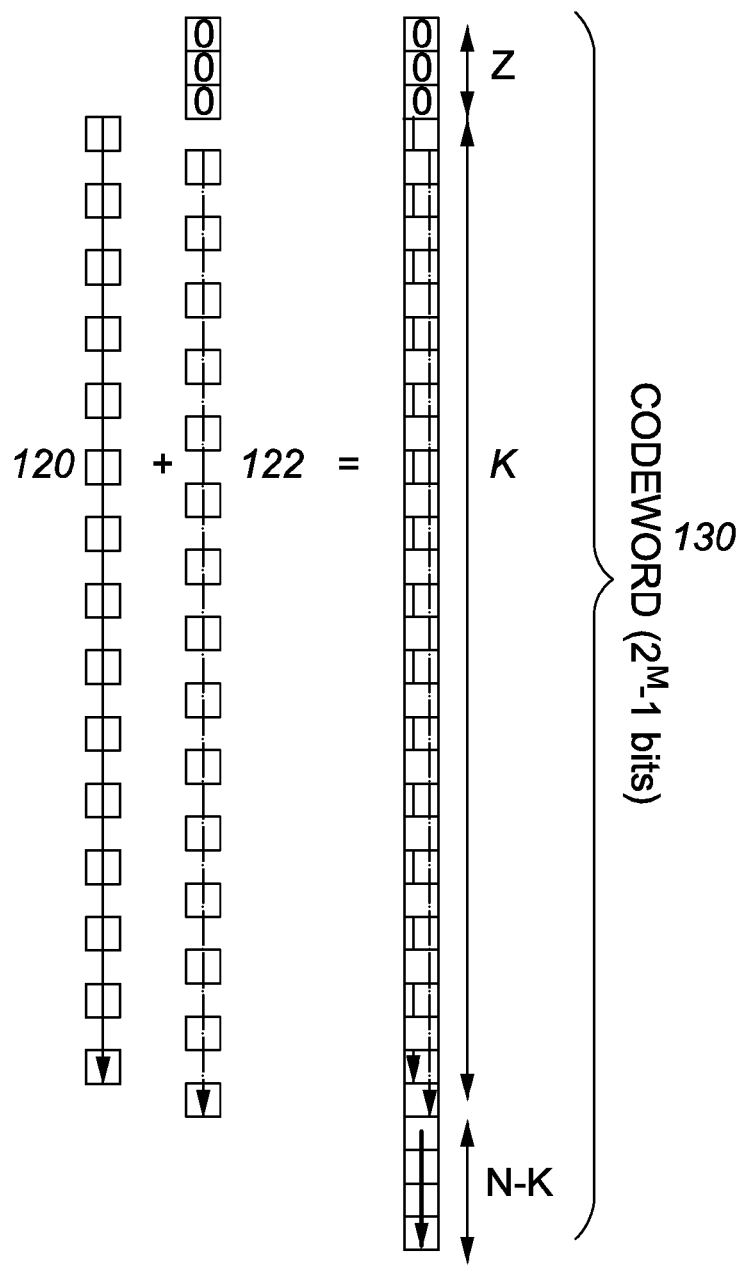
FIG. 4 illustrates a codeword and intermediate elements in a method of codeword construction according to an embodiment of the present disclosure.

An method of constructing a codeword according to an embodiment of the present disclosure can be described as follows, and in relation to reference numerals 120, 122 and 124 (currently 1, 2 and 3) in FIG. 3. FIG. 4 illustrates a codeword and intermediate elements in a method of codeword construction according to an embodiment of the present disclosure.

In step 120, a codeword 130 (shown in FIG. 4) is constructed out of K/2 information bits from a single column, known as the 'home' column 122, alternating with K/2 bits from other columns, or away columns 124, following a diagonal progression shown in steps 126 that skip the 'home' column in each row.

Figure 5:
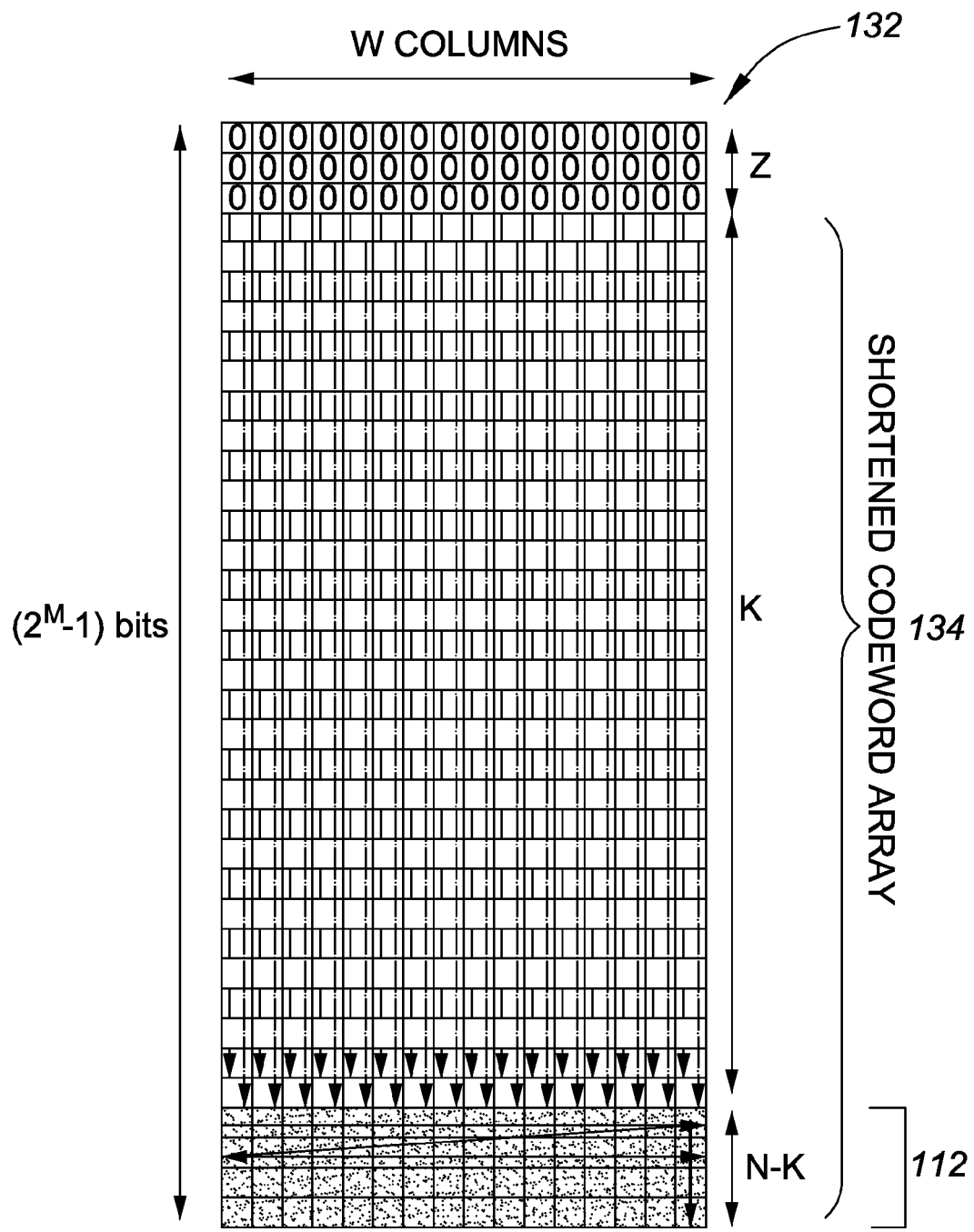
FIG. 5 illustrates a codeword array construction according to an embodiment of the present disclosure.

A shortened codeword array C, also shown in FIG. 5 as 134, can be defined, which is N high and W wide. $c(k_c, w_c)$ is an element of C. The information bit array A, also illustrated as 110, is defined, which is K/2 high by W wide. $a(k_a, w_a)$ is the element of A such that $c(k_c, w_c) = a(k_a, w_a)$.

The first K bits of the codeword 130 shown in FIG. 4 can be constructed using these equations:

$k_a = \text{ceiling}(k_c/2)$ for $1 <= k_c <= K$ $w_a = w_c$ for $1 <= w_c <= W$, $k_c$ odd $w_a = \{[w_c + k_a + \text{floor}((k_a-1)/(W-1)) + 1] \bmod W\} + 1$.

for $1 <= w_c <= W$, $k_c$ even

The BCH parity bits are calculated over each BCH codeword. Parity bits 128 shown in FIG. 3 are parity bits which are generated based on, or associated with, the codewords. The resulting N−K*W parity bits are placed in the parity array P, also shown as 112, $p(i, w) = c(K+i, w)$ for $1 <= i <= N-K$, $1 <= w <= W$.

In order to doubly cover the parity bits, each parity bit is also a member of a Parity Codeword. Each Parity Codeword is assembled by concatenating a convenient number of bits from the Parity Array, with the requirement that no more that T−1 bits from any column may be members of the same Parity Codeword.

FIG. 5 illustrates a codeword array construction according to an embodiment of the present disclosure. FIG. 5 illustrates a codeword array 132 assembled from a plurality of codewords 130 as described in relation to FIG. 4. FIG. 5 also illustrates a shortened codeword array 134 which omits the prepended padding bits as compared to the codeword array 132, and includes the parity bit array 112.

The codeword array comprises W BCH codewords derived from the information bits, and an additional P codewords derived from the parity bits. Each of the W codewords contains K/2 bits from one column, and an additional K/2 bits from the remaining columns.

The choice of M, which is the order of the BCH code, determines the complexity of the decode blocks.

In an embodiment, it is desirable to have T to be as large as practicable.

$T = \text{Floor}(2^M * (1-R)/2M)$.

Choose (N,K) such that it satisfies $N-K = T*M$ $K/N >= R$

Then, choose W such that no two codewords share more than T bits (or, preferably, T−1 bits). This is done by setting $K/2 \ W <= T-1$. The limits on this parameter are latency and memory.

The size of the Message Array is $W*(K/2+(N-K)+N(N-K)/K)$

In an embodiment, a parameter set, for a FEC with R=0.937 is: N=1761, T=5, and W=352.

Figure 6:
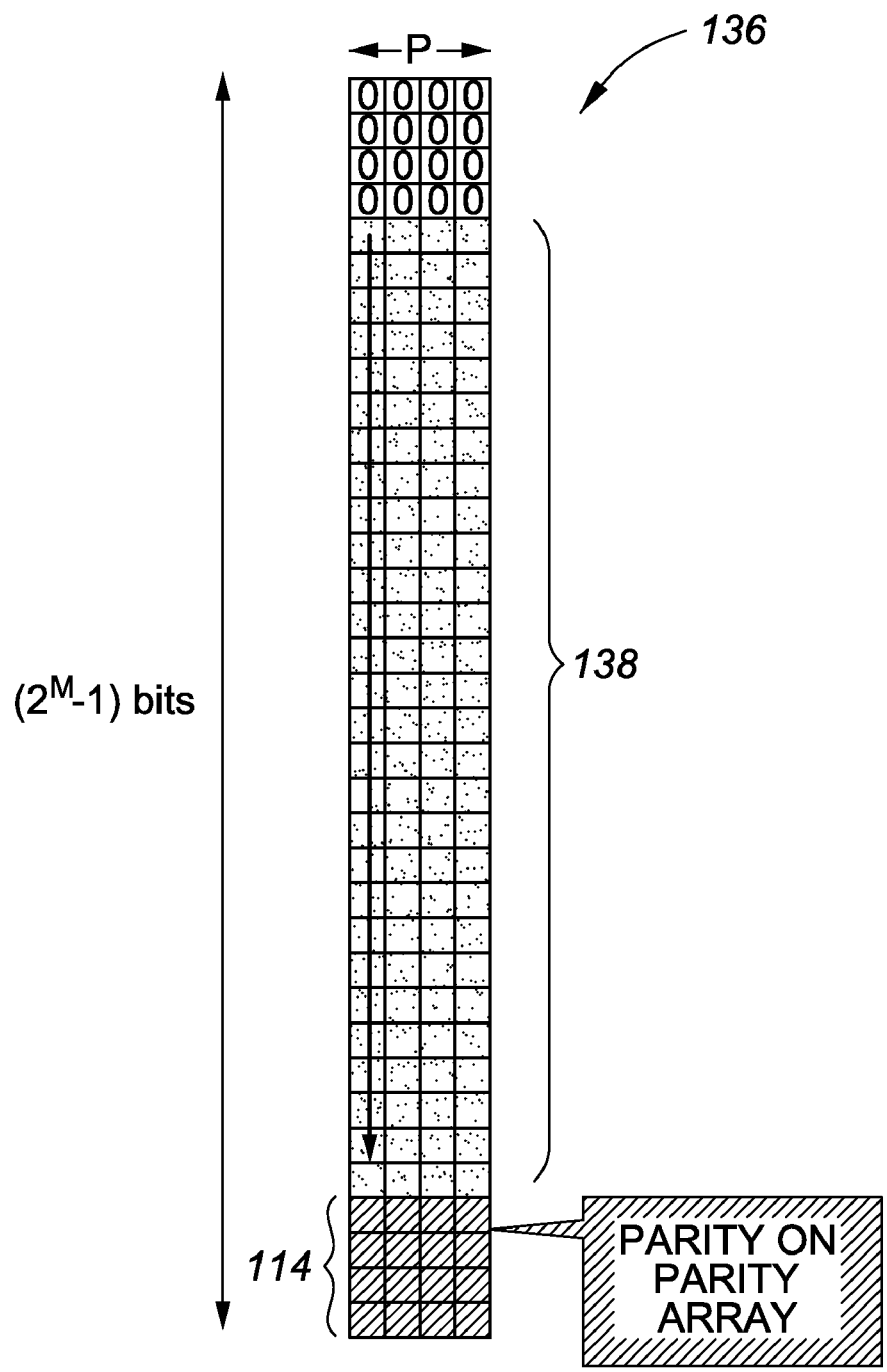
FIG. 6 illustrates a parity-on-parity construction according to an embodiment of the present disclosure.

FIG. 6 illustrates a parity-on-parity construction according to an embodiment of the present disclosure, in relation to a parity codeword array 136. In an embodiment, Mp, Np, Kp, Tp, Wp can be selected for the Parity on Parity array 114. A parity codeword 138 is constructed by rearranging the contents of the parity bit array 112 into a codeword, for example by sequentially traversing parity bit array 112 from left to right, top to bottom, filling each of the P parity on parity codewords equally as shown in FIG. 5. These should be chosen similar to M, N, K, T to balance the protection. However, these parameters may be chosen more for convenience than optimal performance.

Figure 7:
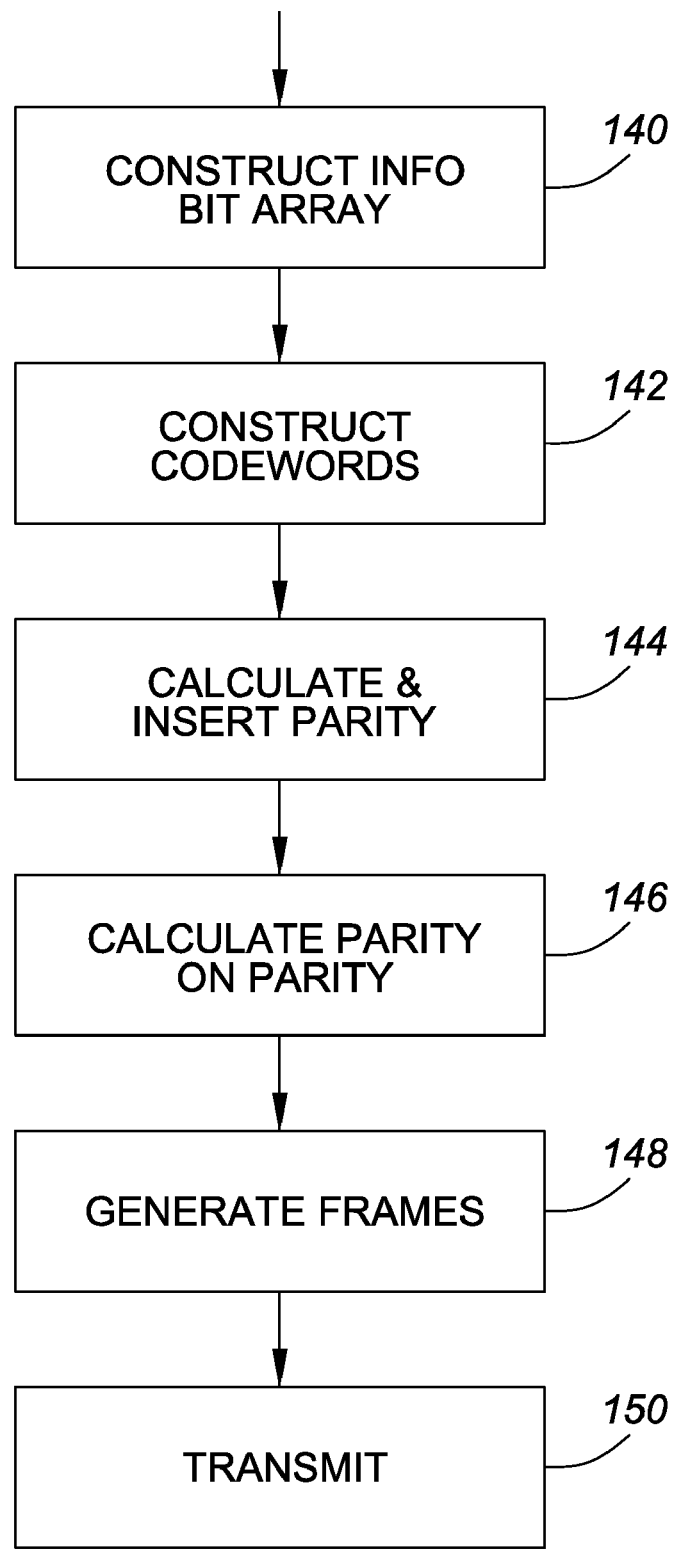
FIG. 7 is a flowchart illustrating an encoding procedure according to an embodiment of the present disclosure.

FIG. 7 is a flowchart illustrating an encoding procedure according to an embodiment of the present disclosure. In an embodiment, the encoding procedure of FIG. 7 can be described as including the following steps: place information bits into information bit array and construct the information bit array (step 140); construct W codewords, each N bits long, with null parity and zero padding (step 142); calculate T*M bits of BCH parity for each codeword, and insert parity into message block (step 144); construct parity codewords, and calculate the parity on parity array (step 146); add framing by generating frames (step 148); and transmit (step 150).

In one embodiment, an apparatus for forward error correction is provided, which performs the method shown in FIG. 7. The apparatus can be implemented using standard logic gates and memories in an integrated circuit, Field-programmable gate array, or similar technology (a 'hardware' embodiment).

One embodiment of the present disclosure can be described as follows describing method steps in relation to associated hardware. Construct the Information bit array by sequentially assigning a row and column address to each incoming data bit. Construct the codewords using a programmable shift register to perform the interleaving function as an interleaver in order to construct the codewords as described above. Calculate BCH parity for the codewords using BCH encoding. Those of ordinary skill in the art will be familiar with steps used for such calculation. The hardware for BCH encoding may be implemented as a convenient number of BCH encoders, each capable of handling one or more BCH codewords in a time-interleaved fashion. Insert the parity bits into each codeword by writing them into the appropriate position in a memory. Form the BCH parity into new codewords, and calculate the 'Parity on Parity' by calculating BCH parity on them by the aforementioned method. Insert the 'Parity on Parity' bits into the message block by writing them into the appropriate position in a memory. Add any desired framing (for instance, G.709 FAS and MFAS, plus a pointer indicating the current row and column position within the message block) and transmit.

In other embodiments, the method in FIG. 7 may be implemented using software instructions executed in a microprocessor, or a blend of 'hardware' and software.

Figure 8:
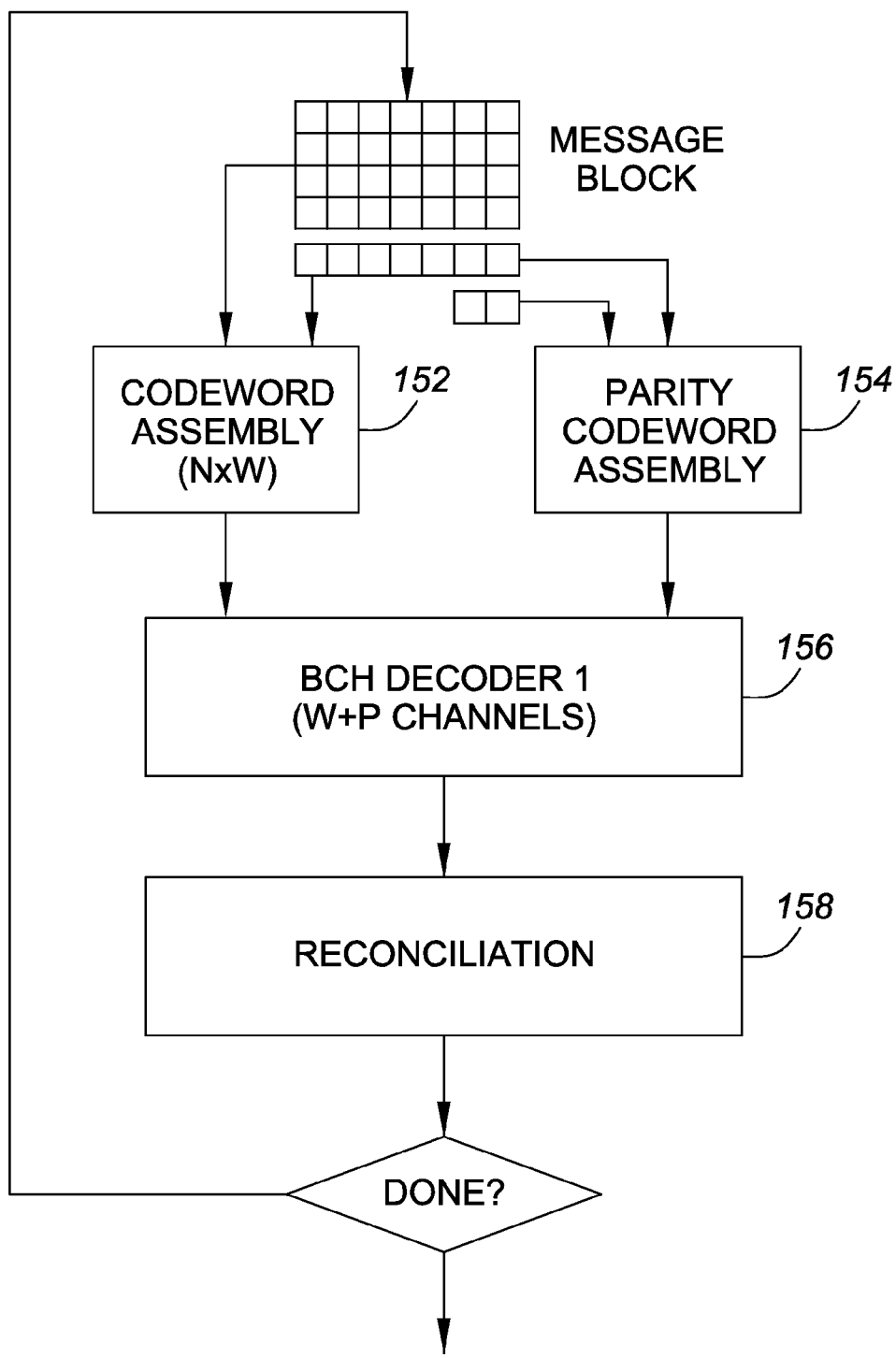
FIG. 8 is a flowchart illustrating a decoding procedure according to an embodiment of the present disclosure.

FIG. 8 is a flowchart illustrating a decoding procedure according to an embodiment of the present disclosure. FIG. 8 demonstrates the baseline decoding procedure. Individual implementations can choose the exact decoder, including the number of iterations.

In an embodiment, the decoding procedure of FIG. 8 can be described as including the following steps: assemble W codewords from the information and parity bits (step 152); assemble parity (P) codewords from the parity and parity-on-parity bits (step 154); decode all codewords simultaneously (step 156). Step 156 can produce an error mask and error count for each codeword, uncorrectable codewords use Mask=0, count=T+1. For each bit in the message, find the two codewords that cover it and reconcile (step 158) their error masks, for example as follows: if the error masks agree, no dispute; otherwise, use mask from codeword with lowest number of corrected bits; repeat for the desired number of stages, or until no further errors are being corrected. A final step (not shown), which can be implemented, is: determine if there are 3 or less uncorrectable BCH. If there are, use an erasure-based BCH decode technique to correct this pattern.

On reception, in step 152 the W codewords are recreated from the received stream by rebuilding the set of codewords from the received block (including adding in the padding zeroes).

Each BCH codeword is then independently decoded in step 156. An error mask, count of corrections, and an uncorrectable indication are generated for each codeword. These, plus the received codeword values, are sent to the Reconciliation block for performing step 158.

With respect to step 158, each message bit, or information bit, is a member of two information codewords, Ca and Cb. The BCH decoder provides an error mask (error mask a for Ca, and error mask b for Cb). A count of the errors detected in each codeword is also provided, along with an indication of whether it is correctible. Confidence in a given codeword is determined by the number of bit errors each one is reporting, and can be stored as a per-codeword confidence metric. Where an information codeword is uncorrectable, its error mask is considered all-zeroes, and its # errors=T+1.

Table 1 illustrates error mask reconciliation according to an embodiment of the present disclosure. The rationale for the reconciliation step is that, when a codeword is falsely corrected, it is much more likely to report a high number of bits corrected (usually T bits). Thus the number of bits corrected is a measure of confidence in the correctness of the decoding, with lower numbers being better.

TABLE 1

Error Mask Reconciliation

| error mask a | error mask b | #errors for $C_a$ < #errors for $C_b$? | Post-Vote Mask | Comment |
| --- | --- | --- | --- | --- |
| 0 | 0 | n/a | 0 | No dispute |
| 1 | 0 | Yes | 1 | $c_a$ wins |
| 0 | 1 | Yes | 0 | $c_a$ wins |
| 1 | 0 | No | 0 | $c_b$ wins |
| 0 | 1 | No | 1 | $c_b$ wins |
| 1 | 1 | n/a | 1 | No dispute |

Note that only W confidence values, or per-codeword confidence metrics, need to be stored, not N×W values, because confidence applies to codewords, or on a per-codeword basis, rather than to individual bits.

In cases where it is impractical to actually compare the error count, it is a reasonable approximation to use just two flags: "Uncorrectible" and "#errors=T". Alternatively, the flags can be: maximum number of corrections done; and less than maximum number of corrections done.

Each parity bit is a member of two codewords: $C_a$ and $P_{b_i}$. These parity codewords are assembled, or calculated, in step 154 and are simultaneously, in step 156, with the information codewords. The parity codewords also use the confidence-based error mask reconciliation of step 158. The post-vote mask is applied to the data, and the data is passed to the next stage.

The steps 152 to 158 are repeated in iterations 2 to S for all information codewords and corresponding party codewords in the received encoded message block. For example, additional BCH decode of all codewords is performed. Each is identical to the first iteration, and works on the output of the previous iteration. In one embodiment, values of S in the range of 6-10 are beneficial. This is equivalent to a 3-5 stage decoder of I.4 or I.7 type, which have separate row and column at each stage.

Reconciliation is iteratively performed after each BCH decode stage, in the same way as for the first iteration. If no additional codewords are being corrected, or when the maximum available in the implementation is reached, iteration ceases.

Erasure Pattern Detection

If a limited number of codewords remain uncorrectable, then all the errors must reside at the intersections of those codewords.

Erasure-decode techniques can be used to cover these cases.

The amount of erasure filling that can practically be done depends on the ratio between T and the maximum number of bits overlapping between any two codewords. For K/2 W<T, a set of three uncorrectable codewords should be correctable. In any event, only a small number of erasure-capable decoders are required.

In one embodiment, an apparatus for forward error correction is provided, which performs the method shown in FIG. 8. The apparatus can be implemented using standard logic gates and memories in an integrated circuit, Field-programmable gate array, or similar technology (a 'hardware' embodiment).

One embodiment of the present disclosure can be described as follows describing method steps in relation to associated hardware. A Framer block (not shown) locates the Message Blocks within the received data stream, by using the framing information added in the step described earlier in relation to FIG. 3. These Message Blocks are presented at the input as shown in FIG. 8. The Codeword Assembly operation is performed using a hardware interleaver, which may be a programmable shift register writing into one or more memory blocks. The Parity Codeword Assembler reassembles the Parity Codewords by extracting the relevant bits from the incoming Message Block and writing them into a memory.

The BCH Decoders are implemented using the well-established techniques of BCH decoding. The number of errors for each codeword may be loaded into a shift register.

The Reconciliation step may be implemented by reading two rows at a time from the codeword array, and then implementing the comparator described in Table 1 on a bitwise basis between the first ('home') row and the second ('away') row. The 'away' row bits and error counts can be lined up with the 'home' row using a programmable shift registers.

The 'Done" decision box can be implemented using standard logic. Repetition of the steps can be done by looping back for multiple passes within the same hardware, or by passing the information to as subsequent, pipelined decoder stage. In either event, decoder stages that are not required may be placed into a low-power state, The Erasure decoding step can be implemented by counting the number of uncorrectable blocks reported by the final stage. Techniques for erasure decode of BCH are well described in the prior art.

In other embodiments, the method in FIG. 8 may be implemented using software instructions executed in a microprocessor, or a blend of 'hardware' and software.

While particular embodiments have been described above, other embodiments are described below.

The parameter values (M, N, K, T, W) are variable and may be chosen differently depending on the desired application.

Swizzle codes can be built with other interleaving schemes other than the one described. For instance the rotational multiple R can be greater than one, so long as R and W−1 are relatively prime. The interleaving scheme described is beneficial, in that it allows for minimal-latency encoding and decoding using a simple programmable shift register.

Block codes other than BCH can be used to build a swizzle code.

The degree of erasure filling can be increased by using various published techniques.

The FEC protecting the Parity Array can have different parameters (or even be a different code type) from the base component code. Adjustments may be required to the error mask reconciliation in this case, to maintain an effective confidence comparison. These adjustments will be apparent to one of ordinary skill in the art.

The value of T can be varied between different codewords to achieve a convenient rate, instead of shortening the codewords.

The number of stages required to decode a block can be varied based on the number and pattern of bit errors in that block. The maximum number desirable is considerably in excess of the average. To reduce the size of the implementation, the FEC can be provisioned with slightly more than the average number of stages required. Each block is decoded iteratively until no more progress is being made. An elastic FIFO is provided to buffer incoming blocks during periods where the decoder is doing many iterations and thus cannot meet line rate. When the FIFO becomes full, the decoder is forced to stop iterating and begin working on new blocks.

Figure 9:
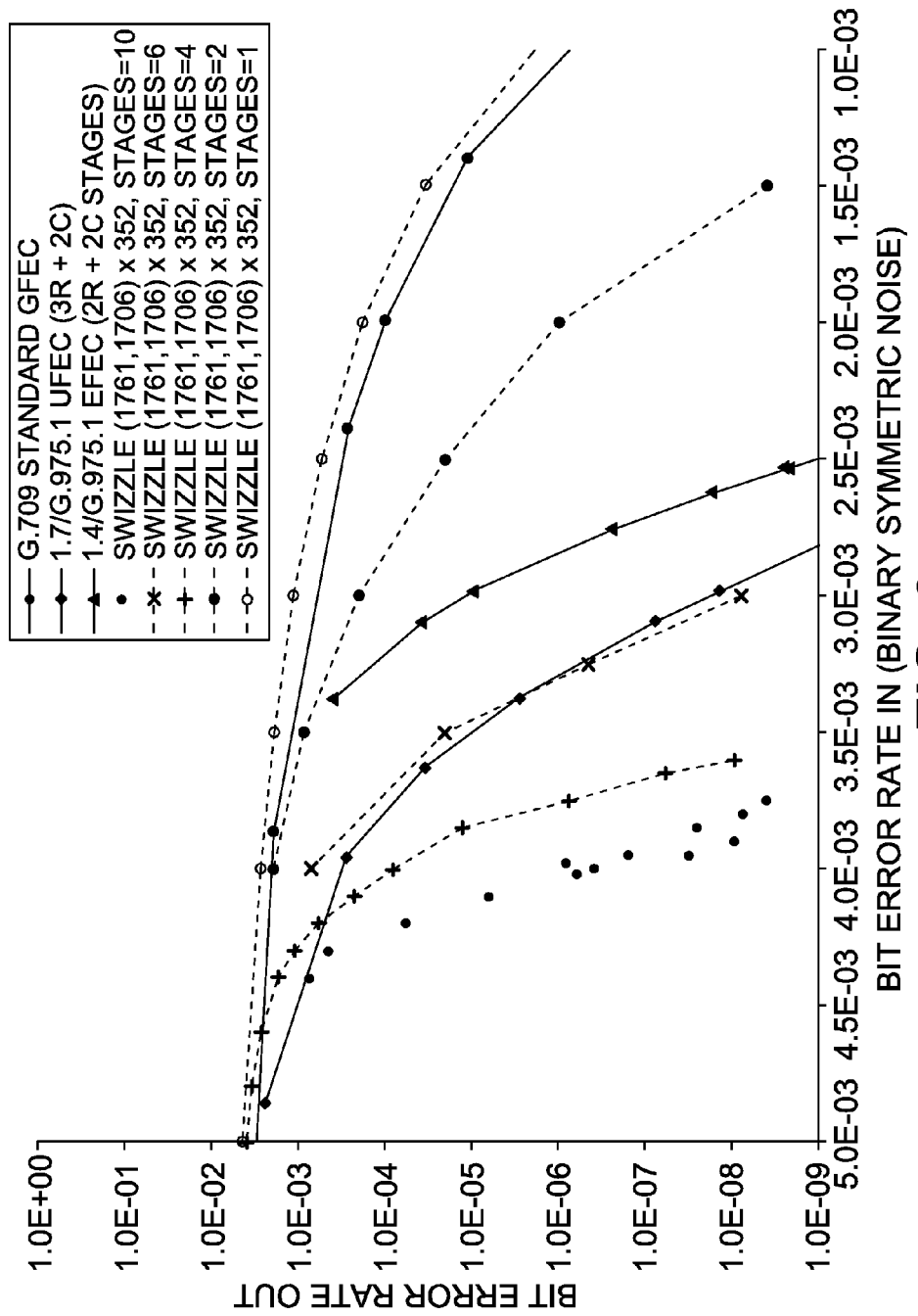
FIG. 9 is a graph illustrating performance of an FEC according to an embodiment of the present disclosure.

FIG. 9 is a graph illustrating performance of an FEC according to an embodiment of the present disclosure. At 1E−8, this FEC has been simulated to improve coding gain by 0.4 dB over I.7, and by 0.6 dB over I.4, in the presence of an AWGN channel followed by a hard-decision slicer. In another embodiment, this performance can be provided down to 1E−13.

The total decode latency of this code is implementation dependant. However, the 2-stage decoder can be implemented with latency under 12 us, and the 10-stage one with latency under 60 us.

The total decode latency of this code is implementation dependant. However, the 2-stage decoder with parameters N-1761, T=5, W=352 can be implemented with latency under 12 us, and the 10-stage one with latency under 60 us for an 111.8 Gbps system.

In the preceding description, for purposes of explanation, numerous details are set forth in order to provide a thorough understanding of the embodiments. However, it will be apparent to one skilled in the art that these specific details are not required in order to practice the embodiments. In other instances, well-known electrical structures and circuits are shown in block diagram form in order not to obscure the subject matter. For example, specific details are not provided as to whether the embodiments of the disclosure described herein are implemented as a software routine, hardware circuit, firmware, or a combination thereof.

Embodiments of the disclosure can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described disclosure can also be stored on the machine-readable medium. Software running from the machine-readable medium can interface with circuitry to perform the described tasks.

Embodiments of the disclosure can be represented as a hardware product implemented in an Integrated Circuit (IC), Programmable Gate Array, or some combination of Integrated Circuit(s), Programmable Gate Array(s), and Software. Those of ordinary skill in the art will appreciate that other functions can also be implemented on such Integrated Circuits or Programmable Gate Arrays.

The above-described embodiments are intended to be examples only. Alterations, modifications and variations can be effected to the particular embodiments by those of skill in the art without departing from the scope of the disclosure, which is defined solely by the claims appended hereto.

What is claimed is:

1. A method of decoding an encoded bit stream at a decoder, the encoded bit stream having encoded information bits, encoded parity bits and encoded parity-on-parity bits, the method comprising:
   assembling information codewords from the encoded information bits and the encoded parity bits;
   assembling parity codewords from the encoded parity bits and the encoded parity-on-parity bits;
   decoding the information codewords and the parity codewords to provide decoded information codewords, decoded parity codewords and associated per-codeword confidence metric for each of the decoded information codewords and for each of the decoded parity codewords; and, for each encoded information bit in the encoded bit stream, each encoded information bit being associated with one decoded information codeword and one decoded parity codeword:

obtaining a decoded information bit based on the one of the two decoded information codeword and the decoded parity codeword having a higher per-codeword confidence metric.

2. The method of claim 1, further comprising decoding parity bits from the encoded bit stream, each parity bit being associated with one decoded information codeword and one decoded parity codeword, wherein for each parity bit to be decoded:

obtaining the decoded parity bit based on one of the decoded information codeword and the decoded parity codeword having a higher per-codeword confidence metric.

3. The method of claim 2, wherein determining the per-codeword confidence metric further comprises determining an error count for each of the decoded information codewords and the decoded parity codewords.

4. The method of claim 3, wherein the per-codeword confidence metric comprises determining a correctability flag for each of the decoded information codewords and the decoded parity codewords.

5. The method of claim 4, wherein the correctability flag is encoded as a particular value of the error count or a particular value of a confidence metric for each of the decoded information codewords and the decoded parity codewords.

6. The method of claim 5, wherein each of the decoded information codewords and the decoded parity codewords is associated with an error mask.

7. The method of claim 6, further comprising assigning a default error mask and a default error count for each of the decoded information codewords and the decoded parity codewords that are uncorrectable.

8. The method of claim 6, wherein each of the decoded information codeword has a corresponding error mask and a corresponding error count, the method further comprising, for each information bit to be decoded:

reconciling the corresponding error codes and the corresponding error counts of the two corresponding decoded information codewords to identify a reconciled information codeword, the reconciled information codeword having the higher per-codeword confidence metric.

9. The method of claim 8, wherein each of the decoded parity codeword has a corresponding error mask and a corresponding error count, the method further comprising:

for each parity bit to be decoded:

reconciling the corresponding error codes and the corresponding error counts of the corresponding decoded information codeword and the decoded parity codeword to identify a reconciled parity codeword, the reconciled parity codeword having the higher per-codeword confidence metric.

10. The method of claim 9, further comprises applying the error mask of the reconciled information codeword and the error mask of the reconciled parity codeword on the reconciled information codeword and the reconciled parity codeword to obtain the decoded information bit and the decoded parity bit, respectively.

11. The method of claim 8, wherein determining the reconciled information codeword is based on comparing the two error counts of the two corresponding information codewords.

12. The method of claim 9, where in determining the reconciled party codeword is based on comparing the two error counts of the two corresponding parity codewords.

13. The method of claim 1, wherein decoding the information codewords and the parity codewords is performed substantially simultaneously.

14. A decoder for decoding an encoded bit stream having encoded information bits, encoded parity bits and encoded parity on parity bits, the decoder comprising:

an information codeword assembly module for assembling information codewords from the encoded information bits and the encoded parity bits;

a parity codeword assembly module for assembling parity codewords from the encoded parity bits and the encoded parity-on-parity bits;

a codeword decoding module for decoding information codewords and parity codewords to provide decoded information codewords and decoded parity codewords and associated per-codeword confidence metric for each of the decoded information codewords and for each of the decoded parity codewords; and an information bit decoding module for decoding each information bit of the encoded bit stream, each information bit being associated with two decoded information codewords, by obtaining the decoded information bit based on one of the two decoded information codeword having a higher per-codeword confidence metric.

15. The decoder of claim 14, further comprising:

a parity bit decoding module for decoding each parity bit of the encoded bit stream, each parity bit being associated with one decoded information codeword and one decoded parity codeword, by obtaining the decoded parity bit based on one of the decoded information codeword and the decoded parity codeword having a higher per-codeword confidence metric.

* * * * *